(12) United States Patent
Choi (10) Patent No.: US 11,205,472 B2
(45) Date of Patent: Dec. 21, 2021

(54) MEMORY DEVICE AND METHOD OF OPERATING THE SAME

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/922,683

(22) Filed: Jul. 7, 2020

(65) Prior Publication Data

US 2021/0257018 A1  Aug. 19, 2021

(30) Foreign Application Priority Data

Feb. 19, 2020 (KR) ........................ 10-2020-0020571

(51) Int. Cl.
*G11C 16/26* (2006.01)
*G11C 11/4091* (2006.01)
*G11C 11/4093* (2006.01)
*G11C 11/4074* (2006.01)
*G11C 11/4094* (2006.01)

(52) U.S. Cl.
CPC ...... *G11C 11/4091* (2013.01); *G11C 11/4074* (2013.01); *G11C 11/4093* (2013.01); *G11C 11/4094* (2013.01)

(58) Field of Classification Search
CPC .................................................. G11C 16/26
USPC .................................................. 365/185.25
See application file for complete search history.

(56) References Cited

U.S. PATENT DOCUMENTS

| 2007/0171711 A1* | 7/2007 | Kang | G11C 16/0483 |
| | | | 365/185.03 |
| 2010/0195386 A1* | 8/2010 | Huh | G11C 16/26 |
| | | | 365/185.03 |
| 2014/0169096 A1* | 6/2014 | Koo | G11C 16/10 |
| | | | 365/185.17 |
| 2021/0118513 A1* | 4/2021 | Kim | G11C 16/24 |

FOREIGN PATENT DOCUMENTS

KR  10-2017-0055910  5/2017

* cited by examiner

*Primary Examiner* — Min Huang
(74) *Attorney, Agent, or Firm* — IP & T Group LLP (57) ABSTRACT

Provided herein is a memory device and a method of operating the same. The memory device may include a string having a plurality of memory cells in which data is stored, and a page buffer coupled to the string through a bit line and configured to precharge the bit line, or sense voltage or current of the bit line. The page buffer may include a first switch configured to transfer the voltage of the bit line to a common sensing node in response to a page buffer sensing signal, a second switch configured to transfer a supply voltage to the common sensing node in response to a common sensing signal, and a third switch configured to couple the common sensing node to a latch in response to a sensing signal and adjust voltage of the common sensing node depending on a voltage level of the sensing signal.

17 Claims, 9 Drawing Sheets

FIG. 11

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0020571, filed on Feb. 19, 2020, which is incorporated herein by reference in its entirety.

BACKGROUND

Field of Invention

Various embodiments of the present disclosure generally relate to a memory device and a method of operating the memory device, and more particularly, to a memory device and a method of operating the memory device, which can improve the sensing reliability of a page buffer.

Description of Related Art

A memory device may store data or output stored data. For example, the memory device may be implemented as a volatile memory device in which stored data is lost when the supply of power is interrupted or as a nonvolatile memory device in which stored data is retained even when the supply of power is interrupted. Such a memory device may include a memory cell array in which data is stored, a peripheral circuit which performs various operations, such as a program operation, a read operation, and an erase operation, and a logic circuit which controls the peripheral circuit.

As the degree of integration of a memory device becomes high, the size of memory cells and an interval between the memory cells are gradually reduced, and thus an interval between strings is also narrowed. When the interval between strings is narrowed, an interval between bit lines coupled to respective strings is also narrowed. Since the bit lines transfer the threshold voltages of memory cells to page buffers during a read or a verify operation, the reliability of a memory device may be deteriorated when interference between the bit lines increases.

SUMMARY

Various embodiments of the present disclosure are directed to a memory device and a method of operating the memory device, which compensate for interference between bit lines during a read or verify operation, thus improving the reliability of the memory device.

An embodiment of the present disclosure may provide for a memory device. The memory device may include a string including a plurality of memory cells in which data is stored, and a page buffer coupled to the string through a bit line and configured to precharge the bit line, or sense a voltage or a current of the bit line. The page buffer may include a first switch configured to transfer the voltage of the bit line to a common sensing node in response to a page buffer sensing signal, a second switch configured to transfer a supply voltage to the common sensing node in response to a common sensing signal, and a third switch configured to couple the common sensing node to a latch in response to a sensing signal and adjust a voltage of the common sensing node depending on a voltage level of the sensing signal.

An embodiment of the present disclosure may provide for a method of operating a memory device. The method may include precharging a bit line coupled to a memory cell to a positive voltage, maintaining or changing a voltage of the bit line depending on a threshold voltage of the memory cell, and sensing the voltage of the bit line through a common sensing node, a first switch, and a sensing node, while adjusting a turn-on level of the first switch to prevent a voltage of the common sensing node from sharply decreasing.

An embodiment of the present disclosure may provide for a memory device. The memory device may include a memory block including a plurality of memory cells in which data is stored, page buffers coupled to the memory block through bit lines, configured to precharge the bit lines to a positive voltage and sense voltages of the bit lines that change with threshold voltages of the memory cells, in response to page buffer control signals, and respectively including latches configured to store the sensed voltages as data, and a logic circuit configured to output the page buffer control signals for controlling the page buffers in response to a command. The logic circuit may adjust the page buffer control signals so that turn-on levels of first switches configured to couple the bit lines to the latches, among switches included in the page buffers, are adjusted to prevent interference between the bit lines coupled to erased cells and programmed cells during a read or verify operation performed on the memory cells.

An embodiment of the present disclosure may provide for a memory device. The memory device may include a memory cell, a page buffer coupled to the memory cell through a bit line, a voltage of which depends on a threshold voltage of the memory cell, and including a first switch configured to transfer the voltage of the bit line to a common sensing node in response to a first signal, a second switch configured to transfer a supply voltage to the common sensing node in response to a second signal, and a third switch configured to couple the common sensing node to a latch in response to a third signal, and a logic circuit configured to generate the first to third signals and change, when sensing the voltage of the bit line, a voltage level of the third signal by a predetermined amount to adjust a turn-on level of the third switch.

DETAILED DESCRIPTION

Figure 1:
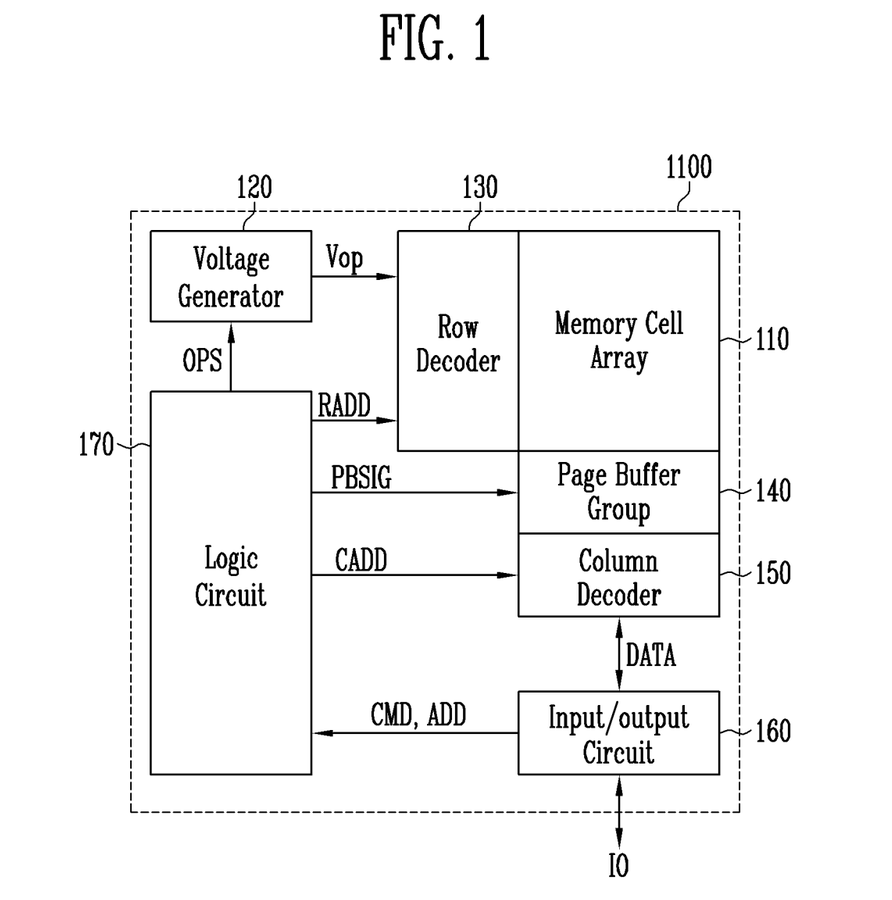
FIG. 1 is a diagram illustrating a memory device according to an embodiment of the present disclosure.

FIG. 1 is a diagram illustrating a memory device according to an embodiment of the present disclosure.

Referring to FIG. 1, a memory device 1100 may include a memory cell array 110 which stores data, peripheral circuits 120 to 160 which perform a program operation, a read operation or an erase operation, and a logic circuit 170 which controls the peripheral circuits 120 to 160.

The memory cell array 110 may include a plurality of memory blocks which store data. Each of the memory blocks may include a plurality of memory cells, which may be implemented in a two-dimensional (2D) structure in which memory cells are horizontally arranged on a substrate, or in a three-dimensional (3D) structure in which memory cells are vertically stacked on a substrate.

The peripheral circuits 120 to 160 may include a voltage generator 120, a row decoder 130, a page buffer group 140, a column decoder 150, and an input/output circuit 160.

The voltage generator 120 may generate and output operating voltages Vop required for various operations in response to operation signals OPS. For example, the voltage generator 120 may generate and output a program voltage, a verify voltage, a read voltage, a pass voltage, an erase voltage, etc.

The row decoder 130 may select one memory block from among the memory blocks included in the memory cell array 110 in response to a row address RADD, transfer operating voltages Vop, and may transmit the operating voltages Vop to the selected memory block.

The page buffer group 140 may be coupled to the memory cell array 110 through bit lines. For example, the page buffer group 140 may include a plurality of page buffers coupled to respective bit lines. The page buffers may be simultaneously operated in response to page buffer control signals PBSIG, and may temporarily store data during a program or read operation. A verify operation performed during a program operation and a verify operation performed during an erase operation may be conducted in the same manner as a read operation. The page buffers may sense the voltages of bit lines changing with the threshold voltages of memory cells during a read operation or verify operation. That is, the result of the sensing operation performed by the page buffers may determine whether the threshold voltages of the memory cells are lower or higher than a read voltage or a verify voltage.

The column decoder 150 may transfer data DATA between the input/output circuit 160 and the page buffer group 140 in response to a column address CADD.

The input/output circuit 160 may be coupled to a controller (not illustrated) through input/output lines IO. The input/output circuit 160 may receive/output a command CMD, an address ADD, and data DATA through the input/output lines IO. For example, the input/output circuit 160 may transmit the command CMD and the address ADD, received through the input/output lines IO, to the logic circuit 170, and may transmit the data DATA, received through the input/output lines IO, to the column decoder 150. The input/output circuit 160 may output the data DATA, received from the column decoder 150, to an external device through the input/output lines IO.

The logic circuit 170 may output the operation signals OPS, the row address RADD, the page buffer control signals PBSIG, and the column address CADD in response to the command CMD and the address ADD. For example, the logic circuit 170 may include software which executes an algorithm in response to the command CMD, and hardware which outputs various signals depending on the address ADD and the algorithm. For example, the logic circuit 170 may adjust the levels of various signals included in the page buffer control signals PBSIG during a read operation or a verify operation.

Figure 2:
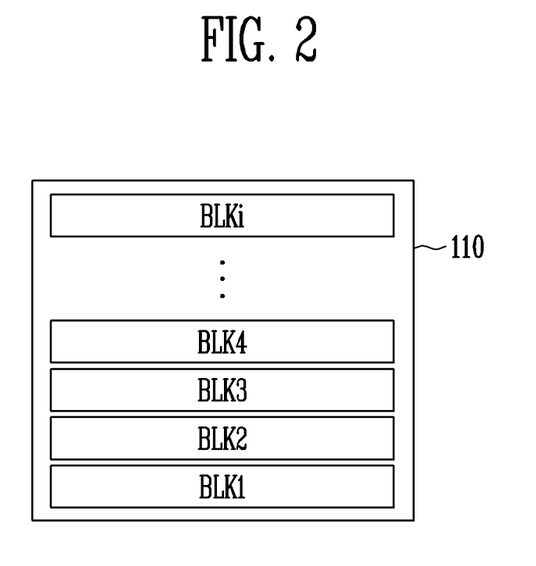
FIG. 2 is a diagram illustrating a memory cell array of FIG. 1.

FIG. 2 is a diagram illustrating the memory cell array of FIG. 1.

Referring to FIG. 2, the memory cell array 110 may include first to i-th memory blocks BLK1 to BLKi, where i is a positive integer. Each of the first to i-th memory blocks BLK1 to BLKi may include a plurality of memory cells, which may be equally configured. Each of the first to i-th memory blocks BLK1 to BLKi may be implemented in a 2D or 3D structure. The 2D structure is a structure in which memory cells are horizontally arranged on a substrate, and the 3D structure is a structure in which memory cells are vertically stacked on a substrate.

Figure 3:
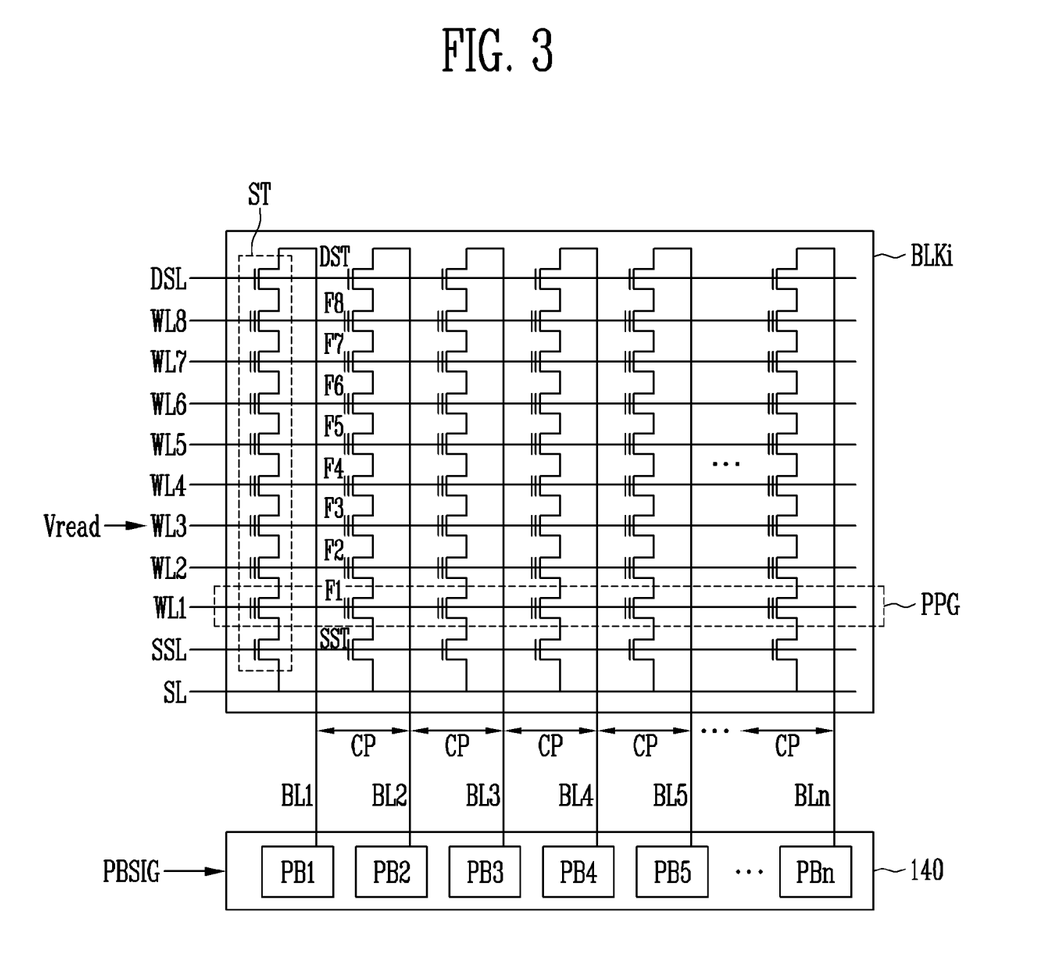
FIG. 3 is a diagram describing a coupling relationship between a memory block and a page buffer group.

FIG. 3 is a diagram describing a coupling relationship between a memory block and a page buffer group.

Referring to FIG. 3, the first to i-th memory blocks BLK1 to BLKi are configured in the same structure, and thus the i-th memory bock BLKi will be described by way of example.

The i-th memory block BLKi may include a plurality of strings ST coupled between first to n-th bit lines BL1 to BLn, where n is a positive integer, and a source line SL. Each of the strings ST may include a source select transistor SST, first to eighth memory cells F1 to F8, and a drain select transistor DST which are coupled in series between the source line SL and a corresponding bit line of the first to n-th bit lines BL1 to BLn. That is, one string ST may be coupled between one bit line (e.g., BL1) and the source line SL, and may include the source select transistor SST, the first to eighth memory cells F1 to F8, and the drain select transistor DST which are coupled in series to each other. The source line SL may be coupled to a ground terminal while a read operation is performed.

Since the i-th memory block BLKi illustrated in FIG. 3 is a component merely used as an example to describe the configuration of the memory block, the number of source select transistors SST, first to eighth memory cells F1 to F8, and drain select transistors DST are not limited to those illustrated in FIG. 3, and may vary depending on design.

Gates of the source select transistors SST coupled to different strings ST may be coupled to a source select line SSL, gates of the first to eighth memory cells F1 to F8 may be coupled to first to eighth word lines WL1 to WL8, respectively, and gates of drain select transistors DST may be coupled to a drain select line DSL.

Memory cells which are coupled to the same word line and are included in different strings ST may configure one physical page (PPG). The memory cells may be programmed or read on a physical page (PPG) basis.

The first to n-th bit lines BL1 to BLn may be respectively coupled to first to n-th page buffers PB1 to PBn included in the page buffer group 140.

The first to n-th page buffers PB1 to PBn may be simultaneously operated in response to page buffer control signals PBSIG. During a read or verify operation, the first to n-th page buffers PB1 to PBn may precharge the first to n-th bit lines BL1 to BLn, or sense the voltages or currents of the first to n-th bit lines BL1 to BLn in response to the page buffer control signals PBSIG.

When the read operation, which is described by way of example, the first to n-th page buffers PB1 to PBn may precharge the first to n-th bit lines BL1 to BLn to a positive voltage in response to the page buffer control signals PBSIG. Then, when a read voltage is applied to a selected word line and a pass voltage is applied to unselected word lines, the voltages of the bit lines may be maintained or decreased depending on the threshold voltages of memory cells coupled to the selected word line. The first to n-th page buffers PB1 to PBn may sense the voltages or currents of the first to n-th bit lines BL1 to BLn, and may then store data of the memory cells.

As the degree of integration of the memory device increases, an interval between the first to n-th bit lines BL1 to BLn becomes narrower. Therefore, when there is the difference between the voltages of adjacent bit lines, coupling (CP) may occur, and the voltages of bit lines may change due to such coupling (CP) during a sensing operation.

Figure 4:
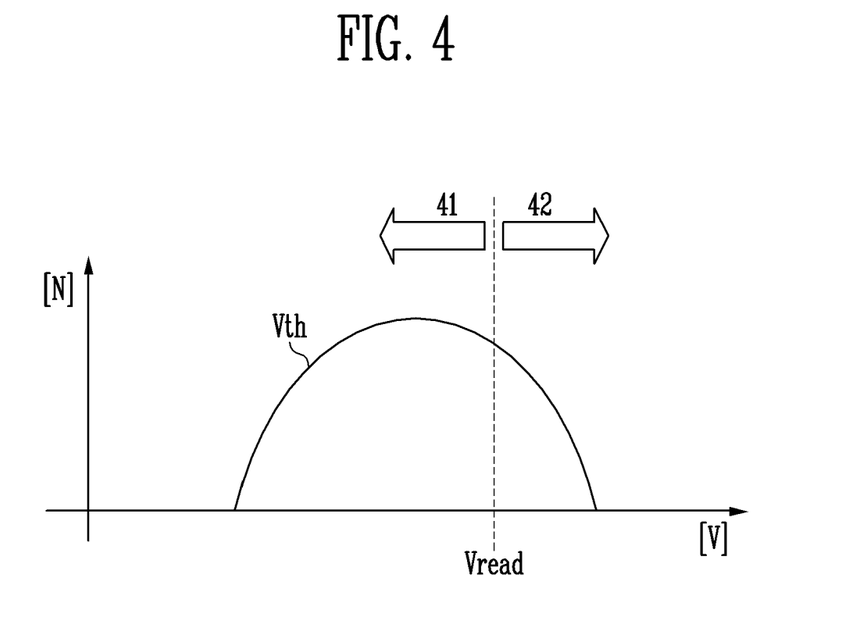
FIGS. 4 and 5 are diagrams describing a change in a bit line voltage depending on the threshold voltages of memory cells.
Figure 5:
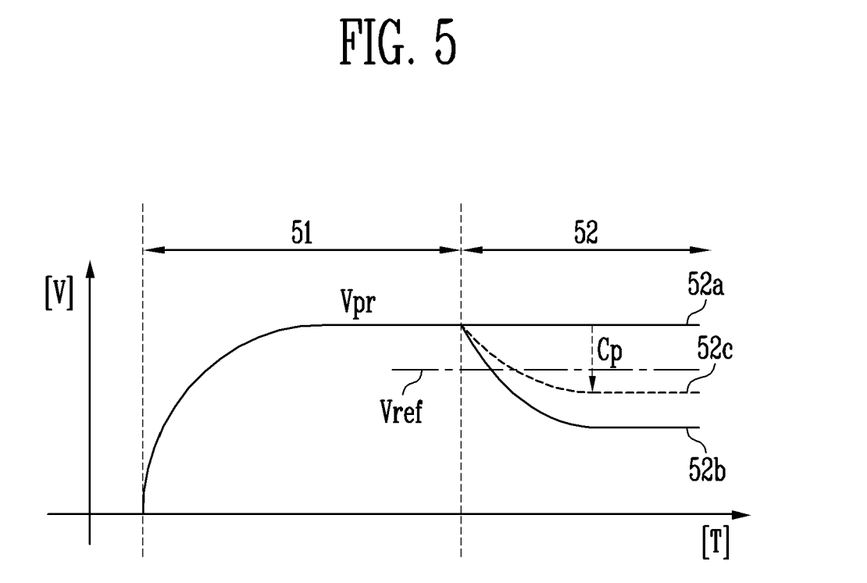

FIGS. 4 and 5 are diagrams describing a change in a bit line voltage depending on the threshold voltages of memory cells. Since the change in the bit line voltage is similar in a read operation and in a verify operation, a description based on the read operation will be made below as an example.

Referring to FIG. 4, the threshold voltages Vth of memory cells forming a specific distribution are illustrated. The threshold voltages Vth of the memory cells may have a horizontally symmetrical distribution with respect to a voltage (V) at which the number of memory cells N is the largest. The drawing illustrates an ideal case, in which the distribution of the threshold voltages Vth is illustrated as being horizontally symmetrical with respect to a center. In reality, the threshold voltages Vth may be distributed asymmetrically with respect to the voltage V at which the number of memory cells N is the largest.

During a read operation, when a read voltage Vread is applied to a selected word line, memory cells coupled to the selected word line may be classified into memory cells 41 having threshold voltages lower than the read voltage Vread and memory cells 42 having threshold voltages higher than the read voltage Vread.

An operation of determining whether the threshold voltages are lower or higher than the read voltage Vread may be referred to as a sensing operation. Depending on the result of the sensing operation, data stored in a latch of the corresponding page buffer may change. The sensing operation may be one of various operations performed during the read operation. The read operation will be described in detail below.

Referring to FIG. 5, during the read operation, a precharge operation 51 and a sensing operation 52 may be sequentially performed. The precharge operation 51 may denote an operation of increasing the voltages of bit lines to a positive precharge voltage Vpr, and the sensing operation 52 may denote an operation of sensing the voltages of the bit lines changing with the threshold voltages of the memory cells, and storing data in the page buffers.

When the sensing operation 52 starts, the voltage of a bit line coupled to a memory cell having a threshold voltage higher than the read voltage Vread may be maintained at a precharge voltage Vpr (52a), and the voltage of a bit line coupled to a memory cell having a threshold voltage lower than the read voltage Vread decreases from the precharge voltage Vpr (52b). For example, when the voltage of the corresponding bit line is higher than a reference voltage Vref, the page buffer may determine that the corresponding memory cell is a programmed cell, and may store data of 0 in the latch, whereas when the voltage of the corresponding bit line is lower than the reference voltage Vref, the page buffer may determine that the corresponding memory cell is an erased cell, and may store data of 1 in the latch. The data stored in the latch may vary depending on settings.

However, when a programmed cell and an erased cell are adjacent to each other in the same page, the voltage of the bit line that should be maintained at the precharge voltage Vpr may decrease due to coupling (CP) to the bit line coupled to the erased cell (52c). At this time, when the voltage of the bit line becomes lower than the reference voltage Vref, the page buffer may falsely determine that the programmed cell is the erased cell, and may then store data of 1 in the latch.

Since this case may occur when the voltages of bit lines coupled to erased cells sharply decrease, the present embodiment may adjust a method of operating the page buffers, thus preventing a decrease in the voltage of a bit line coupled to a programmed cell occurring during a sensing operation.

Figure 6:
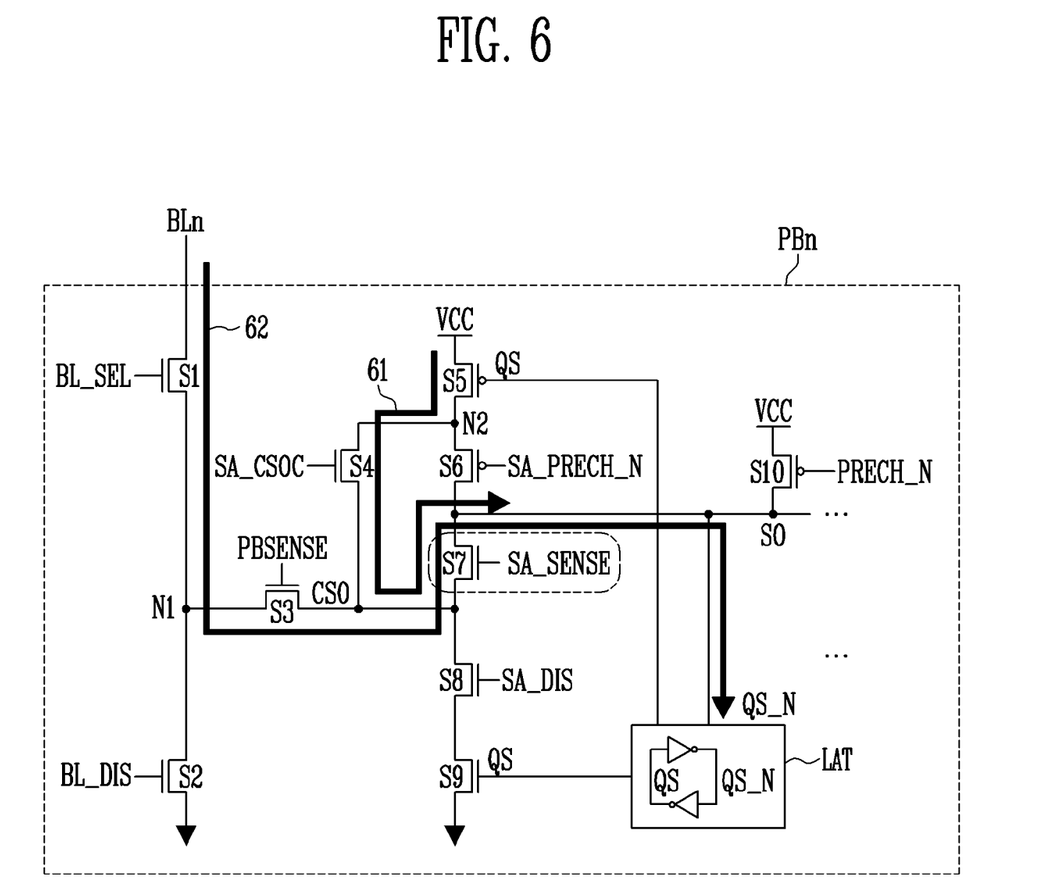
FIG. 6 is a circuit diagram illustrating a page buffer according to the embodiment of the present disclosure.

FIG. 6 is a circuit diagram illustrating a page buffer according to the embodiment of the present disclosure. Since the page buffers PB1 to PBn may be configured in a similar manner, the n-th page buffer PBn, among the page buffers, will be described below by way of example.

Referring to FIG. 6, the n-th page buffer PBn may include a plurality of switches. In FIG. 6, a part of the n-th page buffer PBn is illustrated to help better understand the present embodiment.

The n-th page buffer PBn may include first to tenth switches S1 to S10 and a latch LAT. Although the n-th page buffer PBn may include a plurality of latches LAT, one latch LAT is illustrated in FIG. 6 for convenience of description. Signals that are applied to respective switches illustrated in FIG. 6 may be included in page buffer control signals PBSIG of FIG. 1.

The latch LAT may include a main node QS which stores main data, and an inverting node QS_N which stores inverted data of the main data. For this operation, the latch LAT may include a plurality of inverters.

The first switch S1 may be implemented as an NMOS transistor that is turned on or off in response to a bit line select signal BL_SEL. For example, when the first switch S1 is turned on, the voltage of a first node N1 may be transferred to the n-th bit line BLn, or alternatively, the voltage or current of the n-th bit line BLn may be transferred to the first node N1. The second switch S2 may be implemented as an NMOS transistor which couples or decouples the first node N1 to or from a ground terminal in response to a bit line discharge signal BL_DIS. For example, when the second switch S2 is turned on, the first node N1 may be discharged.

The third switch S3 may be implemented as an NMOS transistor which couples or decouples the first node N1 to or from a common sensing node CSO in response to a page buffer sensing signal PBSENSE. The fourth switch S4 may be implemented as an NMOS transistor which couples or decouples the common sensing node CSO to or from a second node N2 in response to a common sensing signal SA_CSOC.

The fifth switch S5 may be implemented as a PMOS transistor which provides a supply voltage VCC to the second node N2 or blocks the provision of the supply voltage VCC depending on the data stored in the main node QS of the latch LAT. The sixth switch S6 may be implemented as a PMOS transistor which couples or decouples the second node N2 to or from a sensing node SO in response to a sensing node precharge signal SA_PRECH_N. The seventh switch S7 may be implemented as an NMOS transistor which couples or decouples the sensing node SO to or from the common sensing node CSO in response to a sensing signal SA_SENSE.

When the fifth and fourth switches S5 and S4 are turned on, the supply voltage VCC is provided to the common sensing node CSO, and thus the level of the common sensing node CSO may increase. When all of the fifth, fourth, and seventh switches S5, S4, and S7 are turned on, a current path 61 passing through the fifth, fourth, and seventh switches S5, S4, and S7 is formed, and thus the level of the voltage applied to the common sensing node CSO may be influenced by the turn-on levels of the fifth, fourth, and seventh switches S5, S4, and S7. For example, when the turn-on level of the seventh switch S7 increases in a state in which the turn-on level of the seventh switch S7 is lower than those of the fifth and fourth switches S5 and S4, the voltage of the common sensing node CSO may increase while the amount of current flowing through the fifth, fourth, and seventh switches S5, S4, and S7 is increasing. Alternatively, when the turn-on level of the seventh switch S7 decreases, the voltage of the common sensing node CSO may decrease while the amount of current flowing through the fifth, fourth, and seventh switches S5, S4, and S7 is decreasing. In the present embodiment, by changing the turn-on level of the seventh switch S7 as described above, the voltage level of the common sensing node CSO may be adjusted during a sensing operation.

The eighth and ninth switches S8 and S9 may discharge the common sensing node CSO depending on a sensing node discharge signal SA_DIS and the data stored in the main node QS of the latch LAT. The eighth switch S8 may be coupled between the common sensing node CSO and the ninth switch S9, and the ninth switch S9 may be coupled between the eighth switch S8 and the ground terminal. The eighth switch S8 may be implemented as an NMOS transistor which is turned on or off in response to the sensing node discharge signal SA_DIS, and the ninth switch S9 may be implemented as an NMOS transistor which is turned on or off depending on the data stored in the main node QS of the latch LAT. Therefore, when both the eighth and ninth switches S8 and S9 are turned on, the common sensing node CSO may be discharged.

The tenth switch S10 may be implemented as a PMOS transistor which provides or blocks the supply voltage VCC to the sensing node SO in response to a precharge signal PRECH_N.

The sensing node SO may also be coupled to the inverting node QS_N of the latch LAT. Therefore, during the sensing operation, the voltage of the sensing node SO may be transferred to the inverting node QS_N of the latch LAT.

The above-described first and third to ninth switches S1 and S3 to S9 may be used in a precharge operation and a sensing operation, and the tenth switch S10 may be used to precharge the sensing node SO when data is transmitted between the latches in the n-th page buffer PBn.

In addition to the above-described switches, the n-th page buffer PBn may further include a plurality of latches and a plurality of switches which transfer data between the plurality of latches.

In the precharge operation performed during a read operation, the first and third to seventh switches S1 and S3 to S7 may be turned on such that the supply voltage VCC is transferred to the n-th bit line BLn.

In the sensing operation performed during the read operation, the first, third, and seventh switches S1, S3, and S7 may be turned on such that the voltage of the n-th bit line BLn is transferred to the latch LAT (refer to path 62 in FIG. 6). That is, the switches which influence the voltage stored in the latch LAT in the sensing operation may be the first, third, and seventh switches S1, S3, and S7. Among the switches S1, S3, and S7, the switch which has the greatest effect on the transfer of the voltage of the common sensing node CSO to the latch LAT may be the seventh switch S7. Therefore, in the present embodiment, the bit line select signal BL_SEL and the page buffer sensing signal PBSENSE that are respectively applied to the first and third switches Si and S3 may be maintained at levels set in the memory device, and the level of the sensing signal SA_SENSE that is applied to the seventh switch S7 may be adjusted.

During a read operation, a method of operating the page buffer will be described below.

Figure 7:
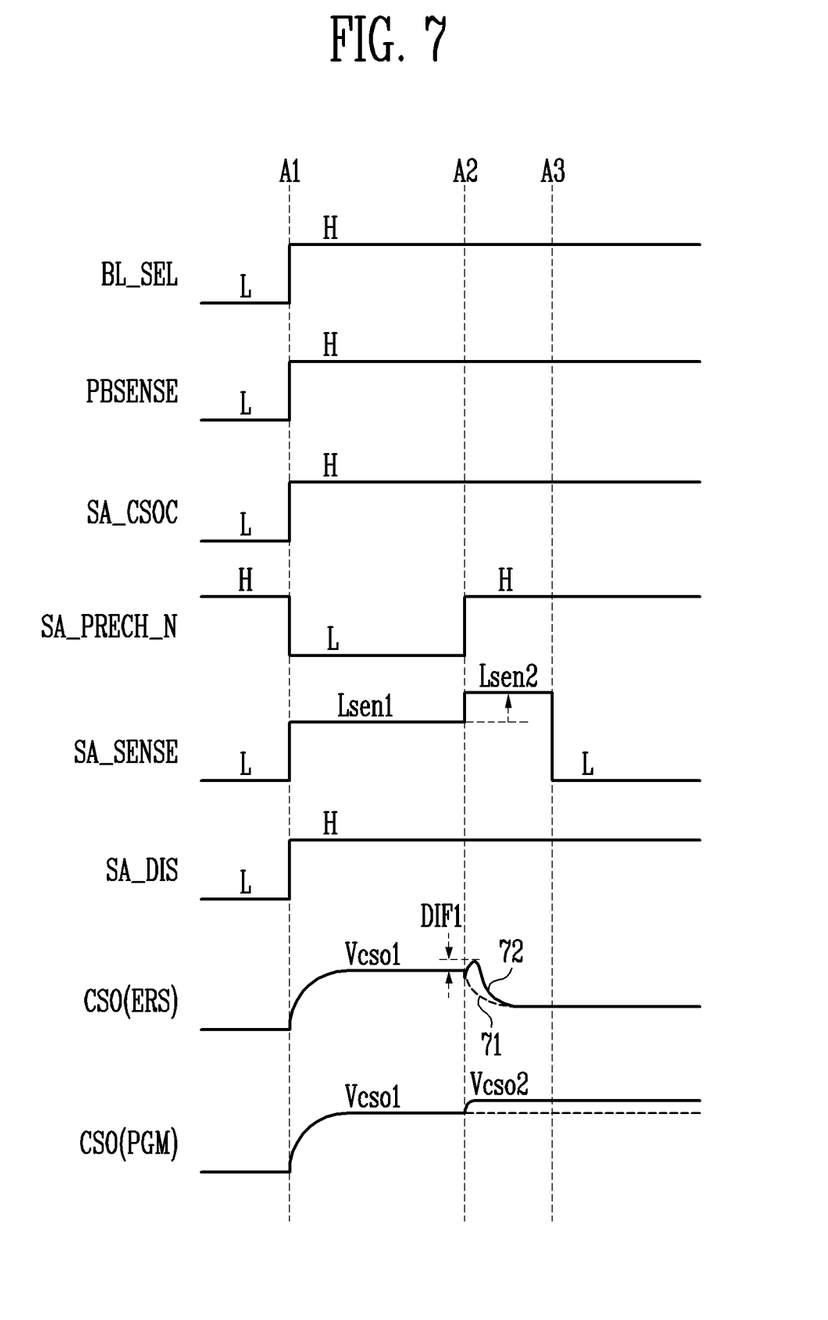
FIG. 7 is a diagram illustrating a method of operating a page buffer according to a first embodiment of the present disclosure.

FIG. 7 is a diagram illustrating a method of operating the page buffer according to a first embodiment of the present disclosure.

Referring to FIGS. 7 and 6, period A1-A2 may be a period during which a precharge operation is performed, and period A2-A3 may be a period during which a sensing operation is performed.

When a read operation starts at A1, a precharge operation of precharging a bit line to a positive voltage may be performed. For example, the latch LAT may be reset such that data of 0 is stored in the main node QS. Here, the data of 0 may be a low (L) signal. Therefore, the fifth switch S5 may be turned on in response to the reset data of 0 stored in the latch LAT. At this time, a turn-off voltage may be applied to the source select line SSL coupled to a selected memory block, and a turn-on voltage may be applied to the drain select line DSL. Therefore, the drain select transistors DST may be turned on, and the source select transistors SST may be turned off.

In order to turn on the first, third, fourth, sixth, and seventh switches S1, S3, S4, S6, and S7, each of the bit line select signal BL_SEL, the page buffer sensing signal PBSENSE, the common sensing signal SA_CSOC, and the sensing signal SA_SENSE may make a transition from low (L) to high (H), and the sensing node precharge signal SA_PRECH_N may make a transition from high (H) to low (L). Here, the level of the sensing signal SA_SENSE which has made a transition to high (H) is defined as a first sensing level Lsen1.

During the period A1-A2 in which the precharge operation is performed, the ninth switch S9 is turned off in response to the reset data stored in the main node QS of the latch LAT, and thus the sensing node discharge signal SA_DIS may continue to remain high (H) for the sensing operation that is to be subsequently performed. Since the tenth switch S10 is not used in the precharge operation and the sensing operation, the precharge signal PRECH_N may remain high (H) although it is not illustrated in the drawing.

Since all of the fourth to seventh switches S4 to S7 are turned on during the period A1-A2, the supply voltage VCC may be transferred to the common sensing node CSO, and thus the common sensing node CSO may be precharged to a first common sensing voltage Vcso1. Regardless of whether the corresponding cell is an erased cell or a programmed cell, the precharge operation is performed on the n-th bit line, and thus the common sensing nodes CSO for all page buffers may be precharged to the first common sensing voltage Vcso1.

Since both the first and third switches S1 and S3 are turned on, the voltage of the common sensing node CSO may be transferred to the n-th bit line BLn, and thus the n-th bit line BLn may be precharged. The voltage of the precharged n-th bit line BLn may be defined as the precharge voltage Vpr.

When the sensing operation starts at A2 after the precharge operation has been completed, a positive turn-on voltage may be applied to the source select line SSL coupled to the memory block, and thus source select transistors SST may be turned on. Accordingly, the channels of the strings ST are electrically coupled to the source line SL, so that the voltage of a bit line coupled to memory cells having threshold voltages lower than the read voltage, among memory cells included in a selected page, may decrease, and the voltage of a bit line coupled to memory cells having threshold voltages higher than the read voltage may be maintained. Here, the memory cells having threshold voltages lower than the read voltage may be defined as erased cells, and the memory cells having threshold voltages higher than the read voltage may be defined as programmed cells.

During the sensing operation, in order to prevent the false sensing of a programmed cell as an erased cell, the logic circuit 170 may increase the level of the sensing signal SA_SENSE from the first sensing level Lsen1 to a second sensing level Lsen2.

In detail, the logic circuit 170 may turn off the sixth switch S6 by causing the sensing node precharge signal SA_PRECH_N to make a transition from low (L) to high (H), and may increase the level of the sensing signal SA_SENSE to the second sensing level Lsen2. When the level of the sensing signal SA_SENSE increases from the first sensing level Lsen1 to the second sensing level Lsen2, the turn-on level of the seventh switch S7 increases, and thus the voltage level of the common sensing node CSO may transiently increase, as described above with reference to FIG. 6.

A change in the voltage of the common sensing node CSO in the sensing operation is described below.

In the case of a bit line coupled to an erased cell, the voltage of the bit line is transferred to the common sensing node CSO, and thus the voltage of the common sensing node CSO(ERS) coupled to the erased cell may decrease (refer to the broken line 71 of FIG. 7). However, since the level of the sensing signal SA_SENSE increases to the second sensing level Lsen2, the supply voltage VCC is provided to the common sensing node CSO, so that the voltage level of the common sensing node CSO may transiently increase, and may thereafter decrease again (refer to the solid line 72 of FIG. 7). In this case, the common sensing node CSO(PGM) coupled to the programmed cell may be maintained at the first common sensing voltage Vcso1 before that time, and may then increase to a second common sensing voltage Vcso2 when the level of the sensing signal SA_SENSE increases to the second sensing level Lsen2. For example, when the voltage of the common sensing node CSO(ERS) coupled to the erased cell increases from the first common sensing voltage Vcso1 by a first voltage difference DIF1, the common sensing node CSO(PGM) coupled to the programmed cell may have the second common sensing voltage Vcso2 that has increased from the first common sensing voltage Vcso1 by the first voltage difference DIF1. Even if the voltage of the common sensing node CSO(PGM) coupled to the programmed cell has increased to the second common sensing voltage Vcso2, the second common sensing voltage Vcso2 does not influence the sensing operation because it is higher than a reference voltage for determining a programmed cell and an erased cell. Since the common sensing node CSO(ERS) coupled to the erased cell is coupled to the bit line, the voltage of which has decreased, the level of the common sensing node CSO(ERS) may decrease to a level lower than the reference voltage during the sensing operation.

Therefore, the false sensing of a programmed cell as an erased cell may be prevented.

Figure 8:
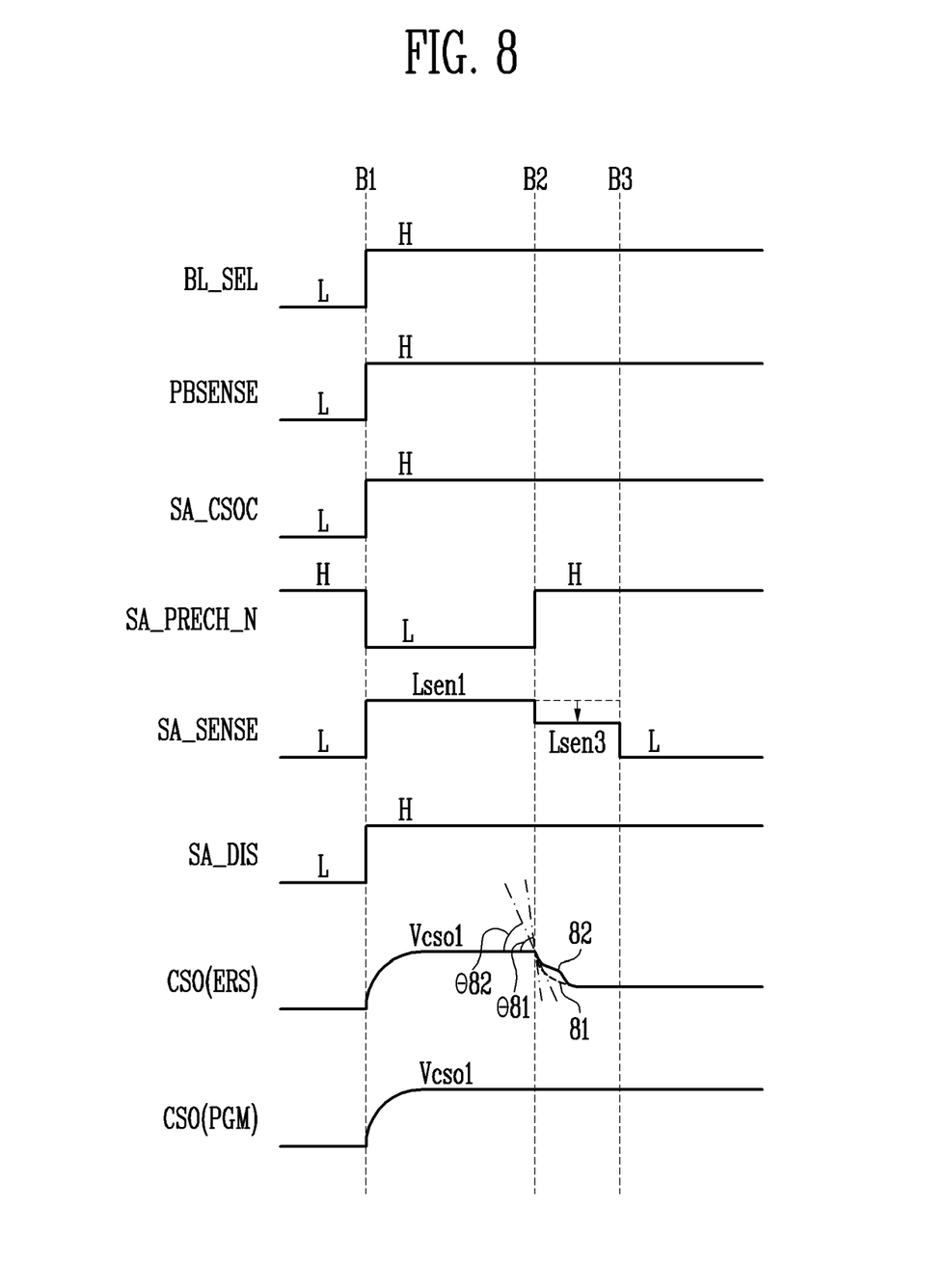
FIG. 8 is a diagram illustrating a method of operating a page buffer according to a second embodiment of the present disclosure.

FIG. 8 is a diagram illustrating a method of operating the page buffer according to a second embodiment of the present disclosure.

Referring to FIGS. 8 and 6, period B1-B2 may be a period during which a precharge operation is performed, and period B2-B3 may be a period during which a sensing operation is performed.

When a read operation starts at B1, a precharge operation of precharging a bit line to a positive voltage may be performed. For example, the latch LAT may be reset such that data of 0 is stored in the main node QS. Here, the data of 0 may be a low (L) signal. Therefore, the fifth switch S5 may be turned on in response to the reset data of 0 stored in the latch LAT. At this time, a turn-off voltage may be applied to the source select line SSL coupled to a selected memory block, and a turn-on voltage may be applied to the drain select line DSL. Therefore, the drain select transistors DST may be turned on, and the source select transistors SST may be turned off.

In order to turn on the first, third, fourth, sixth, and seventh switches S1, S3, S4, S6, and S7, each of the bit line select signal BL_SEL, the page buffer sensing signal PBSENSE, the common sensing signal SA_CSOC, and the sensing signal SA_SENSE may make a transition from low (L) to high (H), and the sensing node precharge signal SA_PRECH_N may make a transition from high (H) to low (L). Here, the level of the sensing signal SA_SENSE which has made a transition to high (H) is defined as a first sensing level Lsen1.

During the period B1-B2 in which the precharge operation is performed, the ninth switch S9 is turned off in response to the reset data stored in the main node QS of the latch LAT, and thus the sensing node discharge signal SA_DIS may continue to remain high (H) for the sensing operation that is to be subsequently performed. Since the tenth switch S10 is not used in the precharge operation and the sensing operation, the precharge signal PRECH_N may remain high (H) although it is not illustrated in the drawing.

Since all of the fourth to seventh switches S4 to S7 are turned on during the period B1-B2, the supply voltage VCC may be transferred to the common sensing node CSO, and thus the common sensing node CSO may be precharged to a first common sensing voltage Vcso1. Regardless of whether the corresponding cell is an erased cell or a programmed cell, the precharge operation is performed on the n-th bit line, and thus the common sensing nodes CSO for all page buffers may be precharged to the first common sensing voltage Vcso1.

Since both the first and third switches S1 and S3 are turned on, the voltage of the common sensing node CSO may be transferred to the n-th bit line BLn, and thus the n-th bit line BLn may be precharged. The voltage of the precharged n-th bit line BLn may be defined as the precharge voltage Vpr.

When the sensing operation starts at B2 after the precharge operation has been completed, a positive turn-on voltage may be applied to the source select line SSL coupled to the memory block, and thus source select transistors SST may be turned on. Accordingly, the channels of the strings ST are electrically coupled to the source line SL, so that the voltage of a bit line coupled to memory cells having threshold voltages lower than the read voltage, among memory cells included in a selected page, may decrease, and the voltage of a bit line coupled to memory cells having threshold voltages higher than the read voltage may be maintained. Here, the memory cells having threshold voltages lower than the read voltage may be defined as erased cells, and the memory cells having threshold voltages higher than the read voltage may be defined as programmed cells.

During the sensing operation, in order to prevent the false sensing of a programmed cell as an erased cell, the logic circuit 170 may decrease the level of the sensing signal SA_SENSE from the first sensing level Lsen1 to a third sensing level Lsen3. Here, the third sensing level Lsen3 may be set to a level which is higher than 0 V and is lower than the first sensing level Lsen1 and at which the seventh switch S7 may remain turned on.

In detail, the logic circuit 170 may turn off the sixth switch S6 by causing the sensing node precharge signal SA_P-RECH_N to make a transition from low (L) to high (H), and may decrease the level of the sensing signal SA_SENSE to the third sensing level Lsen3. When the level of the sensing signal SA_SENSE decreases from the first sensing level Lsen1 to the third sensing level Lsen3, the turn-on level of the seventh switch S7 decreases, and thus the voltage level of the common sensing node CSO may decrease in stages, as described above with reference to FIG. 6.

A change in the voltage of the common sensing node CSO in the sensing operation is described below.

In the case of a bit line coupled to an erased cell, the voltage of the bit line is transferred to the common sensing node CSO, and thus the voltage of the common sensing node CSO(ERS) coupled to the erased cell may sharply decrease (refer to the broken line 81 of FIG. 8).

In this case, as a slope θ81 at which the voltage of the common sensing node CSO(ERS) coupled to the erased cell decreases is larger, the voltage difference between the bit line coupled to the erased cell and the bit line coupled to the programmed cell may increase, thus decreasing the voltage of the bit line coupled to the programmed cell.

However, in the second embodiment, since the level of the sensing signal SA_SENSE does not sharply decrease from the first sensing level Lsen1 to a low level (L), but decreases in stages to the third sensing level Lsen3, and thus a slope θ82 at which the voltage of the common sensing node CSO(ERS) coupled to the erased cell decreases may be reduced (refer to the solid line 82 of FIG. 8). Therefore, since the bit line coupled to the programmed cell may be less influenced by the bit line coupled to the erased cell, the voltage of the common sensing node CSO(PGM) coupled to the programmed cell may be maintained in its previous state.

Figure 9:
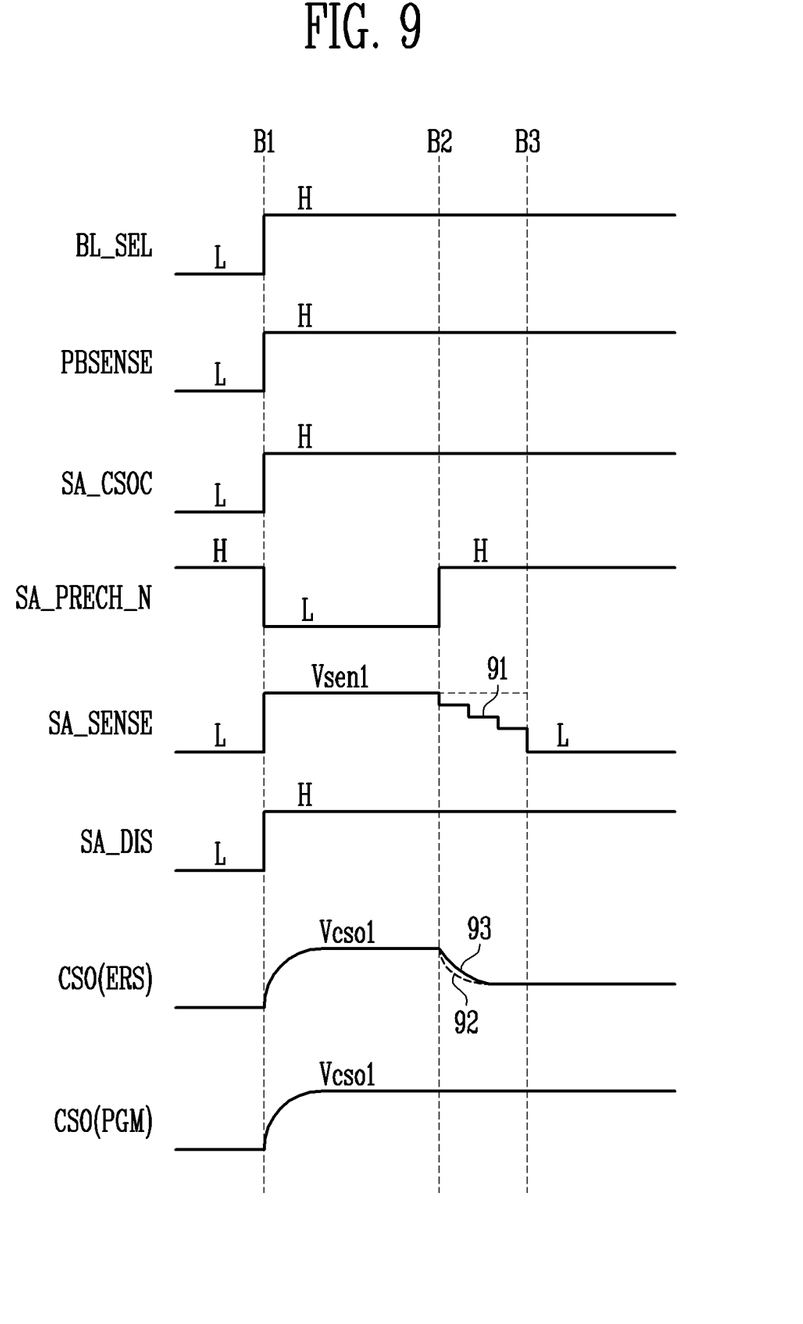
FIG. 9 is a diagram illustrating a method of operating a page buffer according to a third embodiment of the present disclosure.

FIG. 9 is a diagram illustrating a method of operating the page buffer according to a third embodiment of the present disclosure.

Referring to FIGS. 9 and 6, the third embodiment may be performed in the same manner as the second embodiment, and thus repeated descriptions identical to those of the second embodiment will be omitted. After a precharge operation has been performed in the period B1-B2, when a sensing operation starts at B2, the level of the sensing signal SA_SENSE may gradually decrease in a stepped shape (refer to the stepwise solid line 91 of FIG. 9). When the level of the sensing signal SA_SENSE gradually decreases in this way, the level of the common sensing node CSO(ERS) coupled to an erased cell may also gradually decrease (refer to the solid line 93 of FIG. 9) without sharply decreasing (refer to the broken line 92 of FIG. 9). Since the voltage of the common sensing node CSO also influences the voltage of the bit line, coupling that may be exerted on the voltage of the bit line coupled to the programmed cell may be reduced when the voltage of the bit line coupled to the erased cell gradually decreases. Therefore, a decrease in the voltage of the common sensing node CSO(PGM) coupled to the programmed cell may be prevented.

Figure 10:
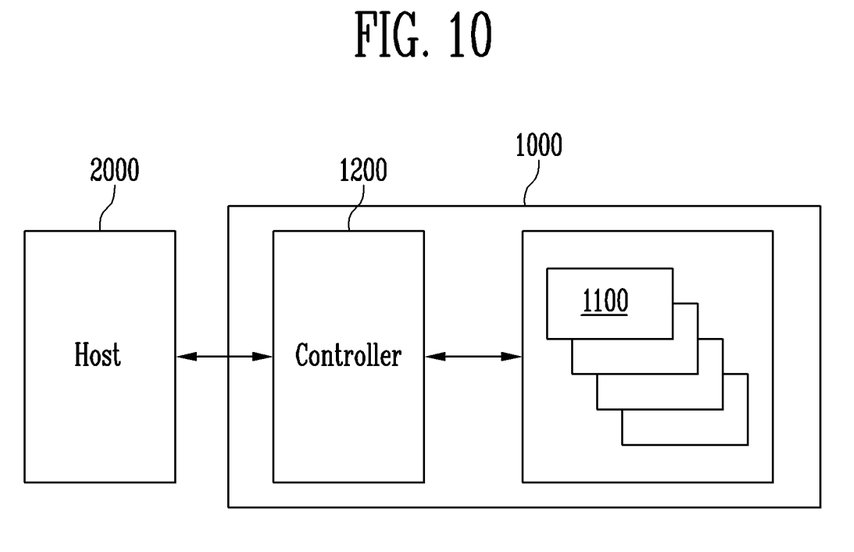
FIG. 10 is a diagram illustrating a memory system including a memory device according to the present disclosure.

FIG. 10 is a diagram illustrating a memory system including a memory device according to the present disclosure.

Referring to FIG. 10, a memory system 1000 may include a memory device 1100 which stores data, and a controller 1200 which performs communication between the memory device 1100 and a host 2000.

The memory system 1000 may include a plurality of memory devices 1100, each of which may be coupled to the controller 1200 through at least one channel. For example, the plurality of memory devices 1100 may be coupled to one channel. Even if a plurality of channels are coupled to the controller 1200, the plurality of memory devices 1100 may be coupled to respective channels.

The controller 1200 may perform communication between the host 2000 and the memory devices 1100. The controller 1200 may control the memory devices 1100 in response to a request from the host 2000, or may perform a background operation for improving the performance of the memory system 1000 regardless of a request from the host 2000. The host 2000 may generate requests for various operations, and may output the generated requests to the memory system 1000. For example, the requests may include a program request for controlling a program operation, a read request for controlling a read operation, an erase request for controlling an erase operation, etc.

The host 2000 may communicate with the memory system 1000 through various interfaces, such as Peripheral Component Interconnect Express (PCIe), Advanced Technology Attachment (ATA), Serial ATA (SATA), Parallel ATA (PATA), serial attached SCSI (SAS), Non-Volatile Memory Express (NVMe), Universal Serial Bus (USB), Multi-Media Card (MMC), Enhanced Small Disk Interface (ESDI), or Integrated Drive Electronics (IDE).

Figure 11:
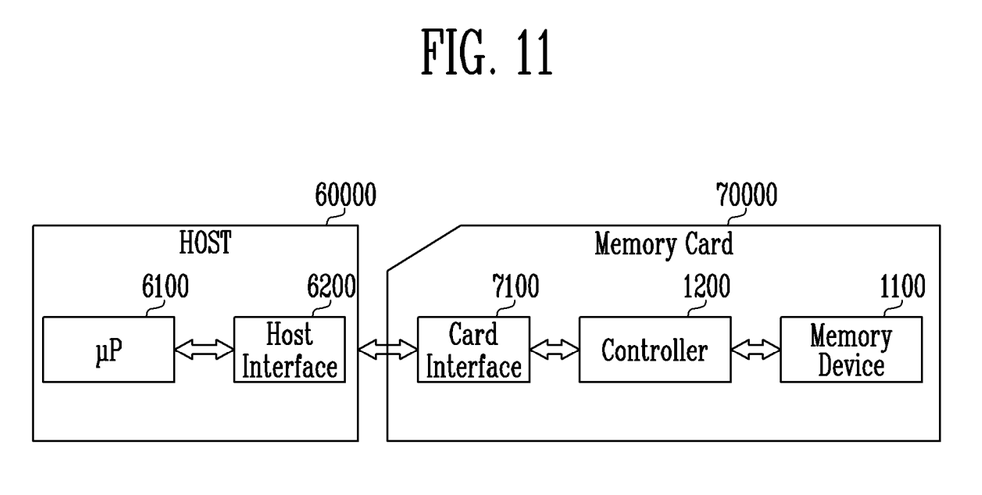
FIG. 11 is a diagram illustrating a memory system including a memory device according to the present disclosure.

FIG. 11 is a diagram illustrating a memory system including a memory device according to the present disclosure.

Referring to FIG. 11, a memory system 70000 may be implemented as a memory card or a smart card. The memory system 70000 may include a memory device 1100, a controller 1200, and a card interface 7100.

The controller 1200 may control data exchange between the memory device 1100 and the card interface 7100. In an embodiment, the card interface 7100 may be, but is not limited to, a secure digital (SD) card interface or a multi-media card (MMC) interface.

The card interface 7100 may interface data exchange between a host 60000 and the controller 1200 according to a protocol of the host 60000. In an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method performed by the hardware.

When the memory system 70000 is coupled to a host interface 6200 of the host 60000 such as a PC, a tablet PC, a digital camera, a digital audio player, a mobile phone, console video game hardware or a digital set-top box, the host interface 6200 may perform data communication with the memory device 1100 through the card interface 7100 and the controller 1200 under the control of a microprocessor (μP) 6100.

The present disclosure may improve the reliability of a sensing operation performed on memory cells during a read or verify operation.

What is claimed is:

1. A memory device, comprising:
a string including a plurality of memory cells in which data is stored; and
a page buffer coupled to the string through a bit line and configured to precharge the bit line, or sense a voltage or a current of the bit line,
wherein the page buffer comprises:
a first switch configured to transfer the voltage of the bit line to a common sensing node in response to a page buffer sensing signal;
a second switch configured to transfer a supply voltage to the common sensing node in response to a common sensing signal; and
a third switch configured to couple the common sensing node to a latch in response to a sensing signal, be turned on in response to the sensing signal during an operation of precharging the bit line and an operation of sensing the voltage of the bit line, and adjust a voltage of the common sensing node depending on a voltage level of the sensing signal.

2. The memory device according to claim 1, wherein, during a read operation performed on a memory cell selected from among the plurality of memory cells, all of the first to third switches are turned on to precharge the bit line to a positive voltage, and
wherein when the voltage of the bit line that changes with a threshold voltage of the selected memory cell is sensed, a level of the sensing signal changes.

3. The memory device according to claim 2, wherein, when the bit line is precharged to the positive voltage, the third switch is turned on in response to the sensing signal having a first sensing level.

4. The memory device according to claim 3, wherein, when the voltage of the bit line is sensed, the sensing signal increases to a second sensing level higher than the first sensing level, or the sensing signal decreases to a third sensing level lower than the first sensing level.

5. The memory device according to claim 4, wherein the third sensing level is set to a level between the first sensing level and a level of 0 V.

6. The memory device according to claim 4, wherein the third sensing level is set to a level that gradually decreases from the first sensing level.

7. A method of operating a memory device, comprising:
precharging a bit line coupled to a memory cell to a positive voltage;
maintaining or changing a voltage of the bit line depending on a threshold voltage of the memory cell; and
sensing the voltage of the bit line through a common sensing node, a first switch, and a sensing node while adjusting a turn-on level of the first switch to prevent a voltage of the common sensing node from sharply decreasing.

8. The method according to claim 7, wherein the precharging of the bit line coupled to the memory cell, to the positive voltage comprises:
providing a supply voltage to the common sensing node through first and second nodes coupled in parallel to a terminal to which the supply voltage is applied; and
transferring the supply voltage, provided to the common sensing node, to the bit line.

9. The method according to claim 8, wherein the maintaining or changing of the voltage of the bit line comprises blocking the second node and providing the supply voltage to the common sensing node through the first node.

10. The method according to claim 7, wherein the adjusting of the turn-on level of the first switch comprises transiently increasing the voltage of the common sensing node by increasing a level of a signal to be applied to a gate of the first switch.

11. The method according to claim 7, wherein the adjusting of the turn-on level of the first switch comprises decreasing the voltage of the common sensing node in stages by decreasing a level of a signal to be applied to a gate of the first switch in stages.

12. A memory device, comprising:
a memory block including a plurality of memory cells in which data is stored;
page buffers coupled to the memory block through bit lines, configured to precharge the bit lines to a positive voltage and sense voltages of the bit lines that change with threshold voltages of the memory cells, in response to page buffer control signals, and respectively including latches configured to store the sensed voltages as data; and
a logic circuit configured to output the page buffer control signals for controlling the page buffers in response to a command,
wherein the logic circuit adjusts the page buffer control signals so that turn-on levels of first switches configured to couple the bit lines to the latches, among switches included in the page buffers, are adjusted to prevent interference between the bit lines coupled to erased cells and programmed cells during a read or verify operation performed on the memory cells.

13. The memory device according to claim 12, wherein the respective page buffers further comprise:
second switches configured to transfer voltages of the bit lines to common sensing nodes in response to a page buffer sensing signal included in the page buffer control signals; and
third switches configured to transfer a supply voltage to the common sensing nodes in response to a common sensing signal included in the page buffer control signals,
wherein the first switches are configured to couple the common sensing nodes to the latches in response to a sensing signal included in the page buffer control signals, and adjust voltages of the common sensing nodes depending on a voltage level of the sensing signal.

14. The memory device according to claim 13, wherein the logic circuit is configured to:
during a read or verify operation performed on the plurality of memory cells, output the page buffer control signals so that all of the first to third switches are turned on to precharge the bit lines to a positive voltage, and
when the voltages of the bit lines that change with threshold voltages of selected memory cells are sensed, change the level of the sensing signal.

15. The memory device according to claim 14, wherein the logic circuit is configured to, when the bit lines are precharged, output the sensing signal having a first sensing level to turn on the first switches.

16. The memory device according to claim 15, wherein the logic circuit is configured to, when the voltages of the bit lines are sensed,
increase the level of the sensing signal to a second sensing level higher than the first sensing level, or decrease the level of the sensing signal to a third sensing level lower than the first sensing level.

17. The memory device according to claim 16, wherein the logic circuit is configured to, when the sensing signal having the third sensing level lower than the first sensing level is output, output the sensing signal having the third sensing level that gradually decreases from the first sensing level.

\* \* \* \* \*